United States Patent
Higashiyama et al.

(10) Patent No.: US 10,119,885 B2
(45) Date of Patent: Nov. 6, 2018

(54) ROLLING BEARING APPARATUS AND DETECTION METHOD FOR ABNORMALITY IN ROLLING BEARING

(71) Applicant: JTEKT CORPORATION, Osaka-shi, Osaka (JP)

(72) Inventors: Yoshimichi Higashiyama, Kashihara (JP); Masami Naka, Yamatokoriyama (JP); Tsukasa Sakazaki, Kizugawa (JP)

(73) Assignee: JTEKT CORPORATION, Osaka-shi (JP)

(*) Notice: Subject to any disclaimer, the term of this patent is extended or adjusted under 35 U.S.C. 154(b) by 5 days.

(21) Appl. No.: 15/412,350

(22) Filed: Jan. 23, 2017

(65) Prior Publication Data
US 2017/0212008 A1  Jul. 27, 2017

(30) Foreign Application Priority Data
Jan. 27, 2016 (JP) ................... 2016-013166

(51) Int. Cl.
| F16C 41/00 | (2006.01) |
| G01M 13/04 | (2006.01) |
| F16C 33/66 | (2006.01) |
| H01L 41/113 | (2006.01) |
| F16C 19/52 | (2006.01) |
| F16C 19/16 | (2006.01) |

(52) U.S. Cl.
CPC ......... *G01M 13/045* (2013.01); *F16C 19/527* (2013.01); *F16C 33/6659* (2013.01); *F16C 33/6674* (2013.01); *F16C 41/004* (2013.01); *H01L 41/1132* (2013.01); *F16C 19/163* (2013.01); *F16C 2233/00* (2013.01); *F16C 2322/39* (2013.01)

(58) Field of Classification Search
CPC .. F16C 19/527; F16C 33/664; F16C 33/6659; F16C 33/6674; F16C 41/00; F16C 2233/00; F16C 2322/39; G01M 13/04; G01M 13/045; H01L 41/1132; G06F 17/142
USPC ........................................ 708/404
See application file for complete search history.

(56) References Cited

U.S. PATENT DOCUMENTS

| 8,172,462 B2* | 5/2012 | Suzuki ............... F16C 33/3806 384/468 |
| 2006/0070462 A1* | 4/2006 | Takizawa ............... B60B 27/00 73/862.541 |

(Continued)

FOREIGN PATENT DOCUMENTS

JP  2003-308588 A  10/2003

*Primary Examiner* — Phillip A Johnson
(74) *Attorney, Agent, or Firm* — Oliff PLC

(57) ABSTRACT

A rolling bearing apparatus includes a bearing main body having an outer ring that is a fixed ring and an inner ring that is a rotating ring, the outer ring and the inner ring being concentrically provided, and a plurality of rolling elements provided between the outer ring and the inner ring, and a control unit having a vibration detector attached to the outer ring and a calculation unit that calculates a value for vibration of the bearing main body and a rotation speed thereof based on a detection signal from the vibration detector. The calculation unit calculates the rotation speed based on frequency components of vibration obtained from the detection signal and the number of vibrations inherent in the bearing main body.

19 Claims, 6 Drawing Sheets

(56) References Cited

U.S. PATENT DOCUMENTS

| | | | |
|---|---|---|---|
| 2006/0165328 A1* | 7/2006 | Ueno | F04B 23/025 |
| | | | 384/462 |
| 2008/0234964 A1* | 9/2008 | Miyasaka | G01H 1/003 |
| | | | 702/113 |
| 2015/0240872 A1* | 8/2015 | Ito | F16C 33/664 |
| | | | 384/471 |

* cited by examiner

ROLLING BEARING APPARATUS AND DETECTION METHOD FOR ABNORMALITY IN ROLLING BEARING

INCORPORATION BY REFERENCE

The disclosure of Japanese Patent Application No. 2016-013166 filed on Jan. 27, 2016 including the specification, drawings and abstract, is incorporated herein by reference in its entirety.

BACKGROUND OF THE INVENTION

1. Field of the Invention

The invention relates to a rolling bearing apparatus and a detection method for abnormality in a rolling bearing, and in particular, to a rolling bearing apparatus equipped with a detector configured to detect abnormality and a detection method for abnormality in the rolling bearing apparatus.

2. Description of the Related Art

Detection units are available which detect abnormality in a rolling bearing based on a rotation speed and vibration. For example, in a rolling bearing apparatus described in Japanese Patent Application Publication No. 2003-308588 (JP 2003-308588 A), a speed detection unit and a vibration sensor are mounted. Specifically, in JP 2003-308588 A, the vibration sensor is attached to a housing of the bearing apparatus. The speed detection unit includes a coil and a magnet. The coil is wound all around the bearing, and the magnet is fixed to a rotating member.

The rolling bearing apparatus detecting the rotation speed and vibration needs both sensors, that is, the detection unit (sensor) configured to detect the rotation speed and the vibration sensor as described in JP 2003-308588 A. Thus, the rolling bearing apparatus disadvantageously has a large number of components and a complicated configuration. The rolling bearing apparatus needs a space where the coil is wound and a space where the vibration sensor is mounted. Thus, the rolling bearing apparatus also disadvantageously has an increased size.

SUMMARY OF THE INVENTION

An object of the invention is to provide a rolling bearing apparatus that enables simplification of a configuration allowing detection of abnormality in rotation of a rolling bearing, and a detection method for the abnormality.

A rolling bearing apparatus in an aspect of the invention includes a bearing main body having a fixed ring and a rotating ring that are concentrically provided and a plurality of rolling elements provided between the fixed ring and the rotating ring, a vibration detector attached to the fixed ring, and a calculation unit that calculates a value for vibration of the bearing main body and a rotation speed of the bearing main body based on a detection signal from the vibration detector. The calculation unit calculates the rotation speed based on frequency components of vibration obtained from the detection signal and the number of vibrations inherent in the bearing main body.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
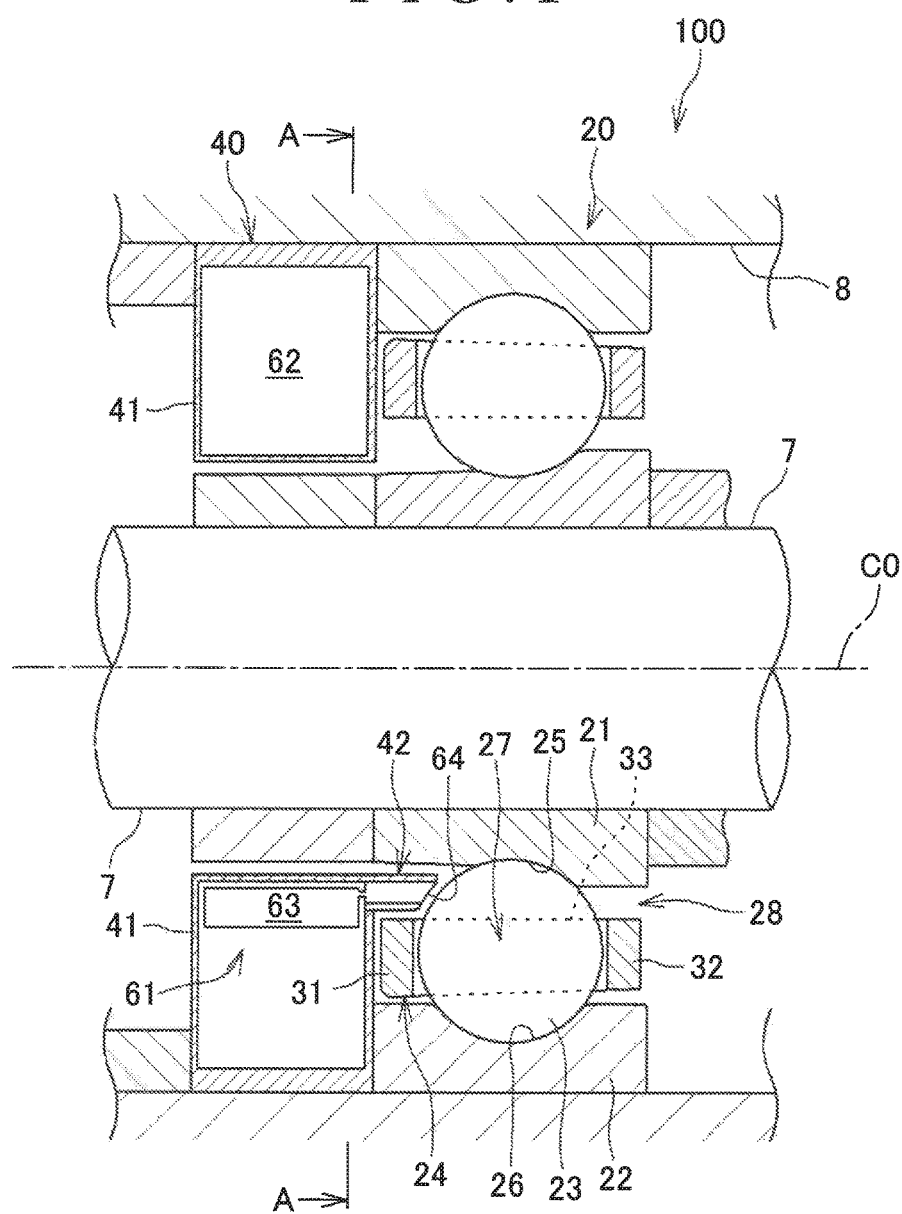
FIG. 1 is a sectional view of a rolling bearing apparatus according to a first embodiment taken along a plane including a center line of a shaft.

With reference to the drawings, a preferred embodiment will be described below. The same components are hereinafter denoted by the same reference numerals. The same components have the same names and functions. Therefore, description of these components is not repeated.

Figure 2:
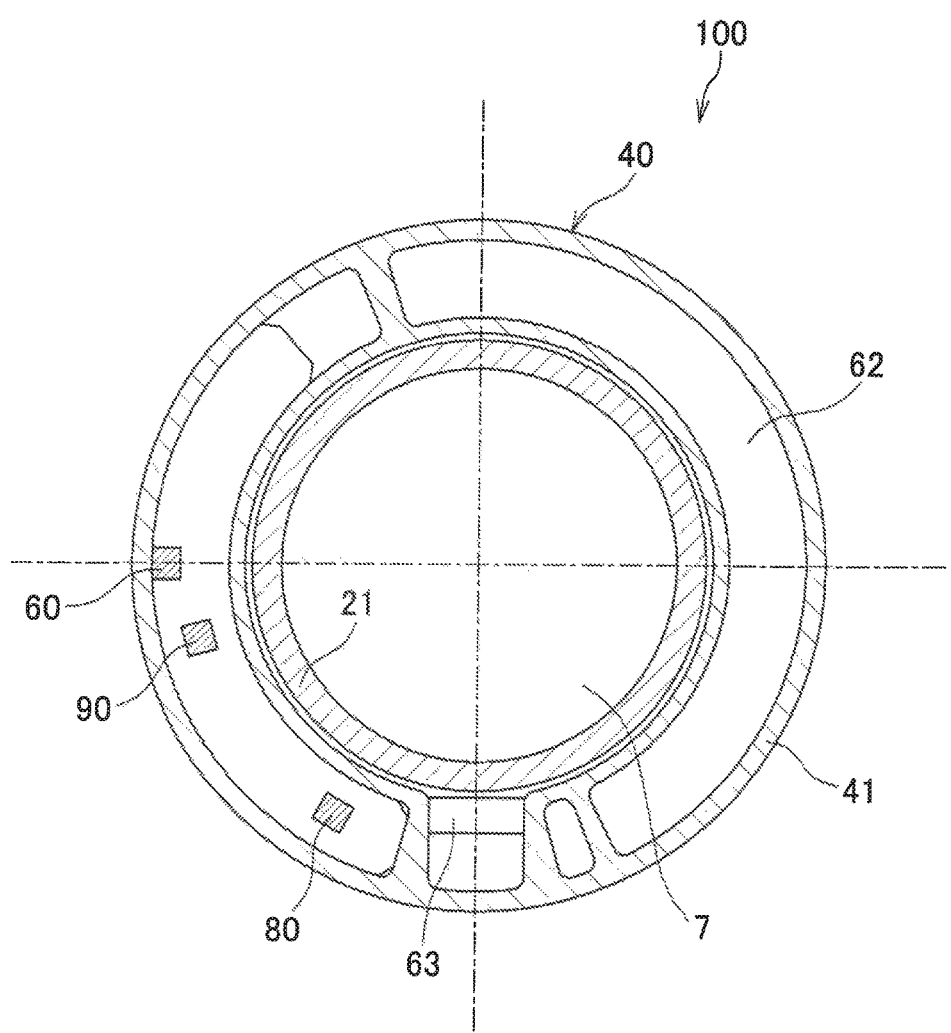
FIG. 2 is a sectional view of the rolling bearing apparatus according to the first embodiment as seen in an axial direction.

A rolling bearing apparatus 100 according to the present embodiment is used for a main spindle of a machine tool. FIG. 1 is a sectional view of the rolling bearing apparatus 100 according to a first embodiment taken along a plane including a center line of a shaft. FIG. 2 is a sectional view of the rolling bearing apparatus 100 according to the first embodiment as seen in an axial direction; the sectional view is taken at an A-A position depicted by arrows in FIG. 1. With reference to FIG. 1 and FIG. 2, the rolling bearing apparatus 100 includes a bearing main body 20, a vibration detector 60, and a control unit 80. Preferably, the rolling bearing apparatus 100 further includes a lubrication unit 40 and a battery 90. The rolling bearing apparatus 100 according to the present embodiment is housed in a bearing housing 8 in order to support the main spindle (shaft 7) of the machine tool so that the main spindle is rotatable.

The bearing main body 20 has an inner ring 21, an outer ring 22, a plurality of rolling elements 23, and an annular cage 24. The cage 24 holds the rolling elements 23. The inner ring 21 is a cylindrical member externally fitted over the shaft 7. A raceway groove (hereinafter referred to as an inner-ring raceway groove 25) is formed on an outer periphery of the inner ring 21 as a raceway surface. The outer ring 22 is a cylindrical member fixed to an inner peripheral surface of the bearing housing 8. A raceway groove (hereinafter referred to as an outer-ring raceway groove 26) is formed on an inner periphery of the outer ring 22 as a raceway surface. The inner ring 21 and the outer ring 22 are concentrically arranged. An annular space 28 is formed between the inner ring 21 and the outer ring 22 that are concentrically arranged. In the present embodiment, the inner ring 21 rotates with the shaft 7 with respect to the outer ring 22.

The rolling elements 23 are interposed in the annular space 28 between the inner ring 21 and the outer ring 22 and roll along the inner-ring raceway groove 25 and the outer-ring raceway groove 26.

The cage 24 is provided in the annular space 28. The cage 24 is an annular member and has a plurality of pockets 27 formed at regular intervals along a circumferential direction to hold the rolling elements 23. The cage 24 has a pair of annular portions 31, 32 and a plurality of cage bars 33. The annular portions 31, 32 are provided on opposite sides of the rolling elements 23 in the axial direction. The cage bars 33 couple the annular portions 31, 32 together. The cage bars 33 are provided at intervals in the circumferential direction. Each of the pockets 27 is an area surrounded by the annular portions 31, 32 and two cage bars 33 adjacent to each other in the circumferential direction. One rolling element 23 is housed in each pocket 27. Consequently, the cage 24 allows the rolling elements 23 to be held in juxtaposition in the circumferential direction.

An annular case 41 internally having a space is provided adjacent to the annular space 28 in the bearing main body 20 on a first side in the axial direction and axially adjacent to the outer ring 22, which is a fixed ring. By way of example, the case 41 is a component of the lubrication unit 40.

As seen in FIG. 2, the vibration detector 60, the control unit 80, and the battery 90 are provided in the space inside the case 41. The vibration detector 60 is electrically connected to the control unit 80 and the battery 90.

The vibration detector 60 is arranged inside the case 41 in contact with the outer ring 22, which is a fixed ring. The vibration detector 60 includes a sensor, for example, a piezoelectric element, to convert a pressure resulting from possible vibration in the bearing main body 20 into a voltage. The vibration detector 60, provided in contact with the outer ring 22, which is a fixed ring, is less likely to be affected by rotation of the bearing main body 20. That is, even if the bearing main body 20 rotates at high speed, no centrifugal force acts on the vibration detector 60, allowing the vibration detector 60 to be prevented from being separated from the bearing main body 20 or being damaged. The bearing main body 20 can be prevented from being damaged by the vibration detector 60 possibly separated from the bearing main body 20. The vibration detector 60 inputs a detection signal corresponding to possible vibration in the bearing main body 20 to the control unit 80. Preferably, the vibration detector 60 converts a pressure resulting from possible vibration in the bearing main body 20 into electric power, and stores the resultant power in the battery 90.

The control unit 80 functions as a calculation unit configured to calculate a value for vibration of the bearing main body 20 and a rotation speed thereof based on the detection signal from the vibration detector 60. Preferably, the control unit 80 can communicate wirelessly or in a wired manner with an external apparatus not depicted in the drawings such as a personal computer (PC). The control unit 80 outputs the value for the vibration and the rotation speed of the bearing main body 20 to the external apparatus as a calculation result. More preferably, the control unit 80 detects abnormality in the bearing main body 20 based on the calculated value for the vibration of the bearing main body 20 and the calculated rotation speed thereof to output a detection result to the external apparatus. A specific example of a calculation method and an example of an abnormality detection method in the calculation unit will be described below.

The lubrication unit 40 is shaped generally like a circular ring and provided adjacent to the annular space 28 in the bearing main body 20 on the first side in the axial direction. The lubrication unit 40 has a case 41 and an extension portion 42. The extension portion 42 extends in the axial direction from the case 41.

In a space inside the case 41 included in the lubrication unit 40, a tank 62 for lubricant (oil) and a pump 61 are further provided. The pump 61 includes a storage portion 63 and a discharge mechanism not depicted in the drawings. The storage portion 63 stores a slight amount of lubricant fed from the tank 62. The discharge mechanism not depicted in the drawings pushes out the lubricant fed to the storage portion 63, through a discharge port 64. Preferably, the control unit 80 is further electrically connected to the discharge mechanism to control a discharge operation (lubricating operation) in the pump 61. Alternatively, the discharge mechanism may be able to communicate with an external control apparatus such as a PC not depicted in the drawings and may perform a lubricating operation under the control of the control apparatus. Specifically, the pump 61 discharges a slight amount of lubricant toward a second side in the axial direction (a right side in FIG. 1) in the form of oil droplets, using the discharge mechanism operating under the control of the control unit 80 or the external control apparatus not depicted in the drawings. The oil droplets discharged through the discharge port 64 are fed to the rolling elements 23 or the inner-ring raceway groove 25. That is, the lubrication unit 40 is provided adjacent to the annular space 28 in the bearing main body 20 in the axial direction so that the lubricant can be fed into the annular space 28.

Preferably, the discharge mechanism is connected to the battery 90 to receive power fed from the battery 90. More preferably, the discharge mechanism performs the lubricating operation using only the power fed from the battery 90 as a power source. Consequently, in the rolling bearing apparatus 100, the lubrication unit 40 performs the lubricating operation without the need for external power supply.

Figure 3:
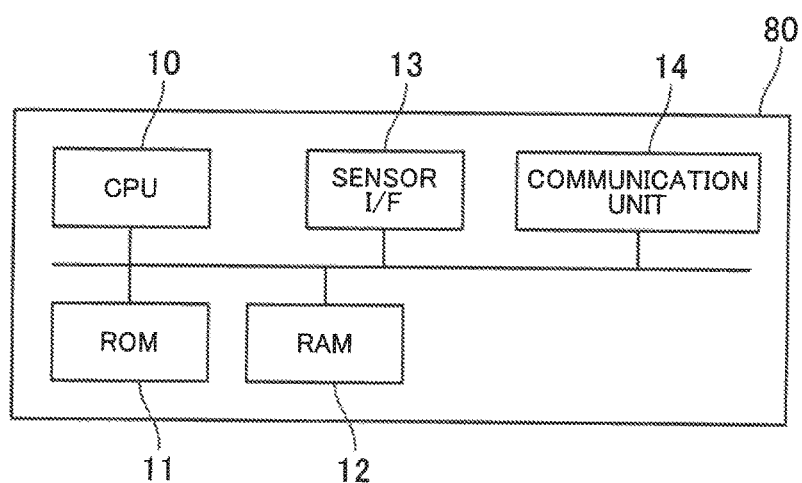
FIG. 3 is a block diagram illustrating an example of an apparatus configuration of a control unit included in the rolling bearing apparatus.

FIG. 3 is a block diagram illustrating an example of an apparatus configuration of the control unit 80. As seen in FIG. 3, the control unit 80 includes a central processing unit (CPU) 10, a read only memory (ROM) 11, a random access memory (RAM) 12, a sensor I/F 13, and a communication unit 14. The CPU 10 controls the apparatus as a whole. The ROM 11 stores programs that are executed by the CPU 10. The RAM 12 serves as a work area where the CPU 10 executes any of the programs. The sensor I/F 13 is an interface (I/F) that implements communication with the vibration detector 60. The communication unit 14 implements communication with the external apparatus not depicted in the drawings.

Figure 4:
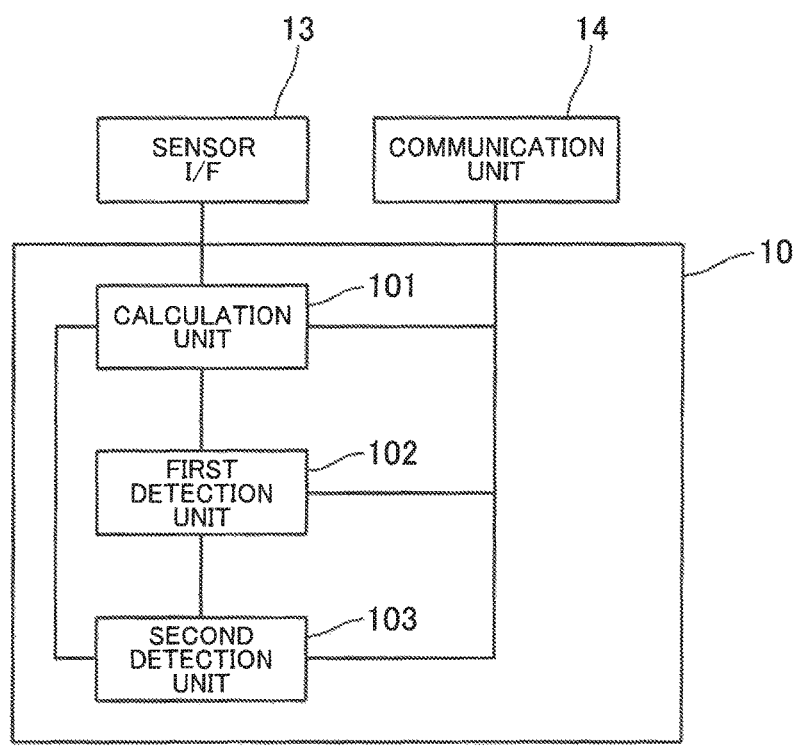
FIG. 4 is a block diagram illustrating an example of a functional configuration of the control unit.

FIG. 4 is a block diagram illustrating an example of a functional configuration allowing the control unit 80 to execute processing based on the detection signal from the vibration detector 60. Each function in FIG. 4 is executed mainly by the CPU 10 in the control unit 80 by reading the relevant program stored in the ROM 11 onto the RAM 12. However, at least some of the functions may be executed by any other hardware such as a dedicated electronic circuit which is not depicted in FIG. 3.

As seen in FIG. 4, the CPU 10 in the control unit 80 includes a calculation unit 101 configured to calculate the value for vibration of the bearing main body 20 and the rotation speed thereof based on the detection signal from the vibration detector 60. Preferably, the CPU 10 includes a first detection unit 102 and a second detection unit 103. The first detection unit 102 detects abnormality in the bearing main body 20 based on the value for vibration of the bearing main body 20 calculated by the calculation unit 101. The second detection unit 103 further detects an area where the abnormality detected by the first detection unit 102 has occurred, based on the rotation speed of the bearing main body 20 calculated by the calculation unit 101. The communication unit 14 may transmit a calculation result from the calculation unit 101 and detection results from the first detection unit 102 and the second detection unit 103 to the external apparatus not depicted in the drawings.

Figure 5:
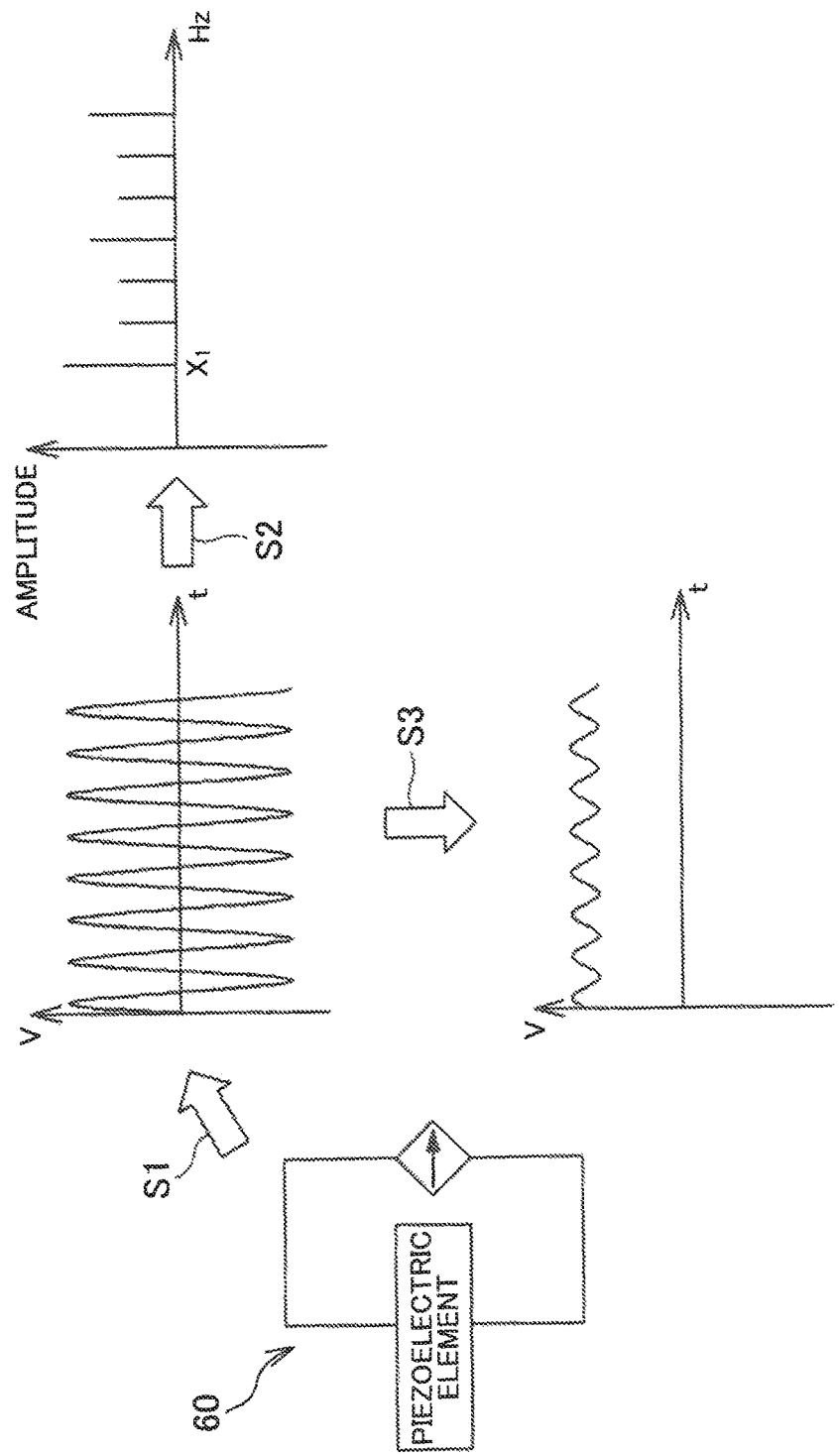
FIG. 5 is a graph illustrating a summary of a calculation method executed by a calculation unit that is a function of the control unit.

FIG. 5 is a diagram illustrating a summary of the calculation method executed by the calculation unit 101. As seen in FIG. 5, the vibration detector 60 including, for example, the piezoelectric element inputs a voltage signal serving as a detection signal corresponding to the vibration of the bearing main body 20, to the control unit 80 (step S1). The calculation unit 101 samples the input voltage signal to determine a waveform, and executes frequency analysis on the waveform utilizing a technique such as Fast Fourier Transformation (FFT) to obtain frequency components. From the resultant frequency components, the calculation unit 101 then acquires at least one peak frequency (X1, X2, . . . Xn) (step S2).

The calculation unit 101 pre-stores the number of vibrations inherent in the bearing main body 20. The number of vibrations inherent in the bearing main body 20 refers to the number N of excitations inherent in an exciting force per rotation of the shaft. The calculation unit 101 stores at least one number of excitations (N1, N2, . . . Nn) for respective exciting forces including the mechanical exciting forces of the rolling elements 23, the shaft 7, and the like, an exciting force resulting from rotation of the shaft 7, and the exciting force (pulsation) of a motor not depicted in the drawings and to which the bearing main body 20 is connected.

The calculation unit 101 divides each of the peak frequencies (X1, X2, . . . Xn) obtained in step S2 by each of the numbers of excitations (N1, N2, . . . Nn) to determine rotation speeds for the respective numbers of excitations (X1/N1, X2/N1, . . . Xn/N1), (X1/N2, X2/N2, . . . Xn/N2), . . . (X1/Nn, X2/Nn, . . . Xn/Nn). The calculation unit 101 compares the rotation speeds (X1/N1, X2/N1, . . . Xn/N1), (X1/N2, X2/N2, . . . Xn/N2), . . . (X1/Nn, X2/Nn, . . . Xn/Nn) calculated for the respective numbers of excitations (N1, N2, . . . Nn) with one another. If any comparison result indicates equality, the calculation unit 101 determines the corresponding rotation speed to be the rotation speed of the bearing main body 20.

In this example, the calculation unit 101 needs to calculate the rotation speeds for the respective numbers of excitations using at least two of the pre-stored numbers of excitations (N1, N2, . . . Nn) and to compare the rotation speeds with one another. However, the calculation method is not limited to the above-described method. In another example, the calculation unit 101 rectifies the voltage signal received from the vibration detector 60 to obtain a DC output (step S3) and determines the range of rotation speeds from the voltage of the DC output. The calculation unit 101 divides each of the peak frequencies (X1, X2, . . . Xn) obtained in step S2 by one pre-stored number of excitations N to determine rotation speeds (X1/N, X2/N, . . . Xn/N) and determine one of the rotation speeds that corresponds to the above-described range to be the rotation speed of the bearing main body 20. That is, the calculation unit 101 may calculate the rotation speed of the bearing main body 20 using only one pre-stored number of excitations.

The first detection unit 102 compares an amplitude at each of the peak frequencies (X1, X2, . . . Xn) obtained in step S2 with an amplitude during normal rotation pre-stored as a threshold. If any of the amplitudes is larger than the threshold, the first detection unit 102 detects abnormality in the bearing main body 20.

If another detector not depicted in the drawings such as a temperature sensor is mounted in the rolling bearing apparatus 100, the first detection unit 102 may detect abnormality in the bearing main body 20 with a detection result from this detector also taken into account.

The second detection unit 103 detects an area where the abnormality has occurred based on the peak frequency determined by the first detection unit 102 to correspond to an amplitude larger than the amplitude during normal rotation, which is the threshold. Specifically, the second detection unit 103 identifies the number of excitations inherent in the exciting force per rotation of the shaft stored in the calculation unit 101 which number is equal to the number of excitations N resulting from division of the peak frequency by the rotation speed of the bearing main body 20 calculated by the calculation unit 101. The second detection unit 103 determines an area corresponding to this number of excitations to be the area where the abnormality has occurred.

Figure 6:
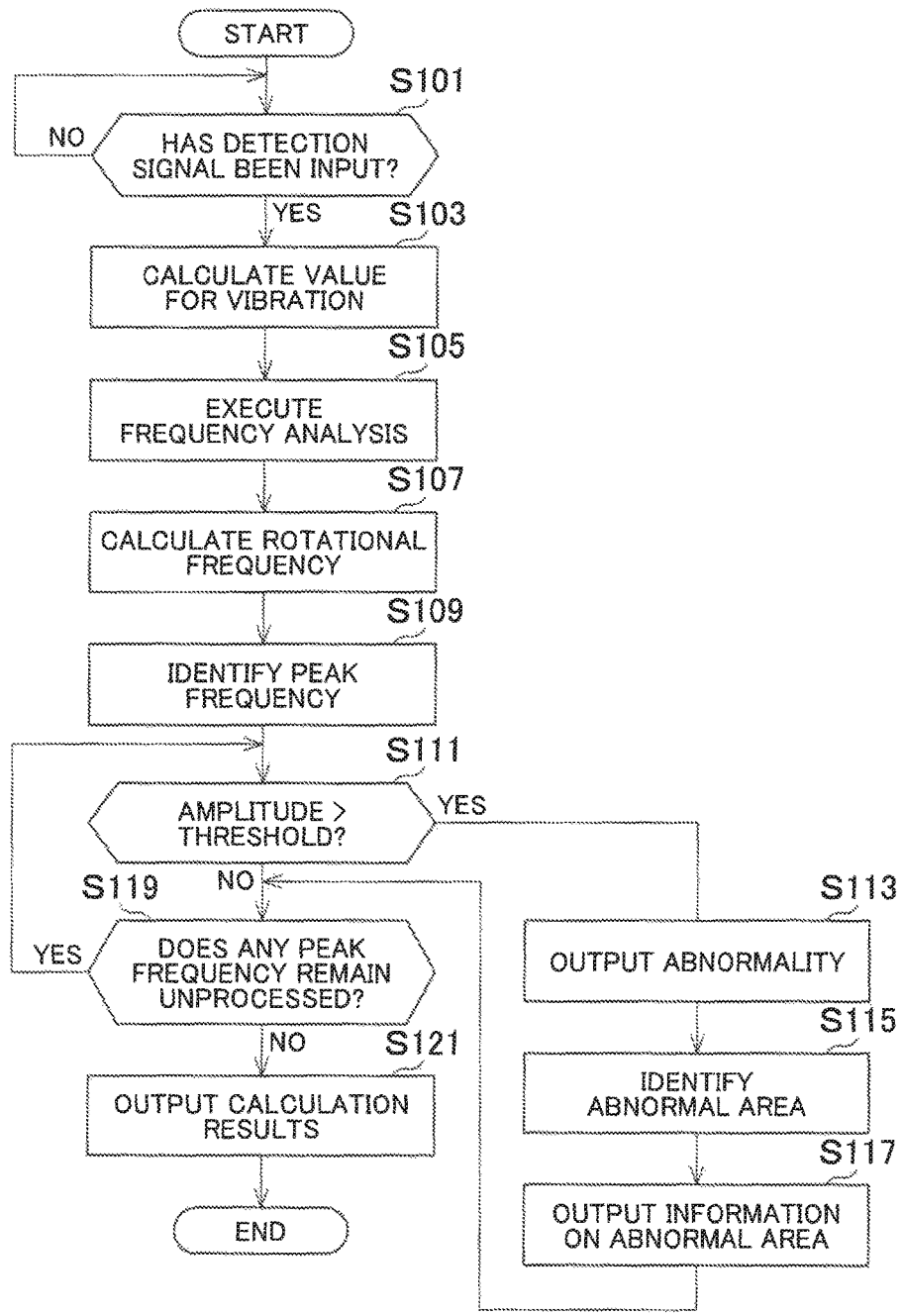
FIG. 6 is a flowchart illustrating an example of a sequence of operations of the control unit.

FIG. 6 is a flowchart illustrating an example of a sequence of operations of the control unit 80. Operations illustrated in FIG. 6 are implemented by the CPU 10 of the control unit 80 by reading the relevant program stored in the ROM 11 onto the RAM 12 and executing the program to allow functions in FIG. 5 to be carried out.

As seen in FIG. 6, the CPU 10 of the control unit 80 accepts an input detection signal from the vibration detector 60 (YES in step S101), and calculates the value for vibration of the bearing main body 20 based on a pressure value indicated by the signal (step S103).

Then, the CPU 10 samples the voltage signal received from the vibration detector 60 to determine a waveform and executes frequency analysis on the resultant waveform (step S105). The CPU 10 calculates the rotation speed of the bearing main body 20 based on the frequency components obtained in step S105 and the pre-stored number of vibrations inherent in the bearing main body 20 (step S107).

The CPU 10 identifies at least one peak frequency in the frequency components obtained in step S105 (step S109), and compares the amplitude at each of the peak frequencies with the amplitude during normal rotation pre-stored as a threshold. Consequently, the CPU 10 detects abnormality in the bearing main body 20 (step S111). Specifically, if any one of the amplitudes at the peak frequencies is larger than the threshold (YES in step S111), the CPU 10 detects abnormality in the bearing main body 20 and outputs the detection result to the external apparatus and the like not depicted in the drawings (step S113). Preferably, the CPU 10 identifies the area where the abnormality has occurred based on the peak frequency indicative of the above-described amplitude used to detect the abnormality and the rotation speed of the bearing main body 20 calculated in step S107 (step S115). The CPU 10 then outputs information indicative of the area to the external apparatus and the like not depicted in the drawings, as a detection result (step S117).

The CPU 10 repeats the operations in steps S111 to S117 on all of the peak frequencies identified from the frequency components obtained in step S105. When the above-described operations are completed for all the identified peak frequencies (NO in step S119), the CPU 10 outputs the value for vibration of the bearing main body 20 calculated in step S103 and the rotation speed of the bearing main body 20 calculated in step S107, to the external apparatus and the like not depicted in the drawings, as calculation results (step S121).

In the rolling bearing apparatus 100 according to the present embodiment, the value for vibration of the bearing main body 20 and the rotation speed thereof are obtained using only the vibration detector 60. Thus, compared to the case of the rolling bearing apparatus equipped with detectors for detecting the value for vibration and the rotation speed, the present embodiment allows the configuration of the rolling bearing apparatus 100 to be simplified.

Moreover, in the rolling bearing apparatus 100, the vibration detector 60 is provided in contact with the outer ring 22, which is a fixed ring. Thus, even when the bearing main body 20 rotates at high speed, no centrifugal force acts on the vibration detector 60. This prevents the vibration detector 60 from being separated from the bearing main body 20 and damaged, and also prevents the vibration detector 60 possibly separated from the bearing main body 20 from damaging the bearing main body 20.

In the rolling bearing apparatus 100 according to the present embodiment, abnormality in the bearing main body 20 is detected based on the detection value from the vibration detector 60. Thus, compared to the case where a sensor configured to detect vibration and a sensor configured to detect the rotation speed are separately mounted, the present embodiment allows abnormality in the bearing main body 20 to be detected while simplifying the configuration of the rolling bearing apparatus 100.

In the rolling bearing apparatus 100 according to the present embodiment, the area in the bearing main body 20 where abnormality has occurred is detected based on the detection value from the vibration detector 60. Thus, compared to the case where a sensor configured to detect vibration and a sensor configured to detect the rotation speed are separately mounted, the present embodiment further allows detection of the area in the bearing main body 20 where abnormality has occurred while simplifying the configuration of the rolling bearing apparatus 100.

In the rolling bearing apparatus 100 according to the present embodiment, power is generated based on the detection signal from the vibration detector 60 and stored in the battery 90. This simplifies the configuration of the rolling bearing apparatus 100 and further enables power generation.

The rolling bearing apparatus 100 according to the present embodiment includes the lubrication unit 40 configured to lubricate the bearing main body 20. The lubrication unit 40 performs the operation of lubricating the bearing main body 20 using power fed from the battery 90 as a power source. In particular, only a slight amount of lubricant from the lubrication unit 40 is needed to lubricate the bearing main body 20. Only low power is needed for the lubricating operation. Thus, in the rolling bearing apparatus 100, electric energy needed for the lubricating operation can be covered by power fed from the battery 90. The bearing main body 20 can be lubricated without the need for external power supply.

In the above description, the example is illustrated in which the control unit 80 is mounted in the rolling bearing apparatus 100. However, the control unit 80 may be a function implemented by another apparatus such as a PC which is separated from the rolling bearing apparatus 100 or a function implemented in cooperation with such an apparatus. In this case, the vibration detector 60 further has a communication function to transmit the detection signal to another apparatus such as a PC. The functions in FIG. 3 are implemented by another apparatus such as a PC and receive detection signals from the vibration detector 60. Consequently, the control unit 80 implemented by another apparatus such as a PC calculates the value for vibration of the bearing main body 20 and the rotation speed thereof and detects abnormality in the bearing main body 20 and the area where the abnormality has occurred.

This configuration also enables simplification of the rolling bearing apparatus 100 as in the case of the rolling bearing apparatus 100 according to the first embodiment, compared to the case where a sensor configured to detect vibration and a sensor configured to detect the rotation speed are separately mounted.

The embodiment disclosed herein is illustrative in every way and should not be considered to be restrictive. The scope of the invention is indicated by appended claims rather than by the above description but, and is intended to embrace the claims and variations within the meaning and range of equivalency.

The invention allows the configuration of the rolling bearing apparatus to be simplified.

What is claimed is:

1. A rolling bearing apparatus comprising:
    a bearing main body having a fixed ring and a rotating ring that are concentrically provided and a plurality of rolling elements provided between the fixed ring and the rotating ring;
    a vibration detector attached to the fixed ring; and
    a control unit that includes a calculation unit for calculating value for vibration of the bearing main body,
    wherein:
        the vibration detector inputs a voltage signal, which serves as a detection signal corresponding to the vibration of the bearing main body, to the control unit,
        the calculation unit samples the input voltage signal to determine a waveform, and executes frequency analysis on the waveform to obtain frequency components,
        the calculation unit stores at least one number of excitations,
        the calculation unit obtains peak frequencies from the frequency components and divides each of the peak frequencies by the number of excitations to determine rotation speeds for the respective number of excitations, and
        the calculation unit compares the rotation speeds calculated for the respective number of excitations with one another, and the calculation unit determines that the respective rotation speed is the rotation speed of the bearing main body if the comparison is equal.

2. The rolling bearing apparatus according to claim 1, further comprising:
    a first detection unit for detecting an abnormality based on an amplitude at a peak frequency obtained from the frequency components.

3. The rolling bearing apparatus according to claim 2, further comprising:
    a second detection unit for detecting an area where the abnormality has occurred based on one of the peak frequencies, the one of the peak frequencies being indicative of the amplitude used by the first detection unit to detect the abnormality and the rotation speed calculated by the calculation unit.

4. The rolling bearing apparatus according to claim 3, wherein:
    the vibration detector generates power using the detection signal, and the rolling bearing apparatus further comprises a battery configured to store the power generated by the vibration detector.

5. The rolling bearing apparatus according to claim 2, wherein:
    the vibration detector generates power using the detection signal, and the rolling bearing apparatus further comprises a battery configured to store the power generated by the vibration detector.

6. The rolling bearing apparatus according to claim 4, further comprising:
    a lubrication unit for lubricating the bearing main body, wherein the lubrication unit performs an operation of lubricating the bearing main body using the power fed from the battery as a power source.

7. The rolling bearing apparatus according to claim 5, further comprising:
a lubrication unit for lubricating the bearing main body,
wherein the lubrication unit performs an operation of lubricating the bearing main body using the power fed from the battery as a power source.

8. The rolling bearing apparatus according to claim 1, wherein:
the vibration detector generates power using the detection signal, and the rolling bearing apparatus further comprises a battery configured to store the power generated by the vibration detector.

9. The rolling bearing apparatus according to claim 8, further comprising:
a lubrication unit for lubricating the bearing main body,
wherein the lubrication unit performs an operation of lubricating the bearing main body using the power fed from the battery as a power source.

10. A detection method for detecting an abnormality in a rolling bearing, the detection method comprising:
calculating a value for vibration of the rolling bearing and a rotation speed of the rolling bearing based on a detection signal from a vibration detector, the vibration detector being attached to a fixed ring that is concentrically provided in the rolling bearing together with a rotating ring; and
detecting abnormality in the rolling bearing,
wherein:
calculating the value for vibration and the rotation speed includes calculating the rotation speed based on frequency components of the vibration and the number of vibrations inherent in the rolling bearing, and
detecting the abnormality includes detecting the abnormality based on an amplitude at a peak frequency obtained from the frequency components.

11. A rolling bearing apparatus comprising:
a bearing main body having a fixed ring and a rotating ring that are concentrically provided and a plurality of rolling elements provided between the fixed ring and the rotating ring;
a vibration detector attached to the fixed ring; and
a calculation unit for calculating a value for vibration of the bearing main body,
wherein:
the vibration detector inputs a voltage signal, which serves as a detection signal corresponding to the vibration of the bearing main body, to the control unit,
the calculation unit samples the input voltage signal to determine a waveform, and executes frequency analysis on the waveform to obtain frequency components,
the calculation unit stores at least one number of excitations,
the calculation unit rectifies the voltage signal received from the vibration detector to obtain a DC output and determines a range of rotation speeds from the voltage of the DC output, and
the calculation unit divides each of the peak frequencies by one pre-stored number of excitations to determine rotations speeds and to determine one of the rotation speeds that corresponds to the range to be the rotation speed of the bearing main body.

12. The rolling bearing apparatus according to claim 11, further comprising:
a first detection unit for detecting an abnormality based on an amplitude at a peak frequency obtained from the frequency components.

13. The rolling bearing apparatus according to claim 12, further comprising:
a second detection unit for detecting an area where the abnormality has occurred based on one of the peak frequencies, the one of the peak frequencies being indicative of the amplitude used by the first detection unit to detect the abnormality and the rotation speed calculated by the calculation unit.

14. The rolling bearing apparatus according to claim 13, wherein:
the vibration detector generates power using the detection signal, and the rolling bearing apparatus further comprises a battery configured to store the power generated by the vibration detector.

15. The rolling bearing apparatus according to claim 14, further comprising:
a lubrication unit for lubricating the bearing main body,
wherein the lubrication unit performs an operation of lubricating the bearing main body using the power fed from the battery as a power source.

16. The rolling bearing apparatus according to claim 12, wherein:
the vibration detector generates power using the detection signal, and the rolling bearing apparatus further comprises a battery configured to store the power generated by the vibration detector.

17. The rolling bearing apparatus according to claim 16, further comprising:
a lubrication unit for lubricating the bearing main body,
wherein the lubrication unit performs an operation of lubricating the bearing main body using the power fed from the battery as a power source.

18. The rolling bearing apparatus according to claim 11, wherein:
the vibration detector generates power using the detection signal, and the rolling bearing apparatus further comprises a battery configured to store the power generated by the vibration detector.

19. The rolling bearing apparatus according to claim 18, further comprising:
a lubrication unit for lubricating the bearing main body,
wherein the lubrication unit performs an operation of lubricating the bearing main body using the power fed from the battery as a power source.

* * * * *